United States Patent
Kang et al.

(10) Patent No.: US 12,137,600 B2
(45) Date of Patent: Nov. 5, 2024

(54) DISPLAY APPARATUS

(71) Applicant: SAMSUNG DISPLAY CO., LTD., Yongin-si (KR)

(72) Inventors: Dongjin Kang, Yongin-si (KR); Changhee Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 453 days.

(21) Appl. No.: 17/511,964

(22) Filed: Oct. 27, 2021

(65) Prior Publication Data

US 2022/0293683 A1 Sep. 15, 2022

(30) Foreign Application Priority Data

Mar. 15, 2021 (KR) .......................... 10-2021-0033595

(51) Int. Cl.
| | |
|---|---|
| H10K 65/00 | (2023.01) |
| G06V 40/13 | (2022.01) |
| H10K 39/32 | (2023.01) |
| H10K 59/12 | (2023.01) |
| H10K 59/38 | (2023.01) |

(52) U.S. Cl.
CPC ............ *H10K 65/00* (2023.02); *H10K 39/32* (2023.02); *H10K 59/12* (2023.02); *H10K 59/38* (2023.02); *G06V 40/1318* (2022.01)

(58) Field of Classification Search
None
See application file for complete search history.

(56) References Cited

U.S. PATENT DOCUMENTS

| | | |
|---|---|---|
| 10,268,884 B2 | 4/2019 | Jones et al. |
| 10,514,500 B2 | 12/2019 | Wang et al. |
| 10,872,223 B2 | 12/2020 | Ding et al. |
| 10,984,208 B2 | 4/2021 | Zhu et al. |

(Continued)

FOREIGN PATENT DOCUMENTS

| | | |
|---|---|---|
| CN | 107068716 A | 8/2017 |
| CN | 107122759 A | 9/2017 |

(Continued)

OTHER PUBLICATIONS

Andrew Wadsworth et al., "The Bulk Heterojunction in Organic Photovoltaic, Photodetector, and Photocatalytic Applications," Adv. Mater., 2020, 27 pages, Wiley-VCH GmbH.

(Continued)

*Primary Examiner* — Evren Seven
(74) *Attorney, Agent, or Firm* — CANTOR COLBURN LLP

(57) ABSTRACT

A display apparatus includes: a first unit pixel including a plurality of light-emitting diodes, and a second unit pixel including a plurality of light-emitting diodes and a photodetector diode. Each of the plurality of light-emitting diodes includes a first electrode, a second electrode facing the first electrode, and an emission layer disposed between the first electrode and the second electrode, and the photodetector diode includes a third electrode, a fourth electrode facing the third electrode, an active layer disposed between the third electrode and the fourth electrode, and a color filter layer disposed between the fourth electrode and the active layer.

20 Claims, 10 Drawing Sheets

(56) References Cited

U.S. PATENT DOCUMENTS

| | | | |
|---|---|---|---|
| 2005/0205903 A1* | 9/2005 | Hioki | H10K 85/652 |
| | | | 257/E27.135 |
| 2015/0331508 A1* | 11/2015 | Nho | G06V 40/1306 |
| | | | 345/173 |
| 2019/0013368 A1* | 1/2019 | Chung | H10K 59/351 |
| 2020/0308167 A1 | 10/2020 | Choi et al. | |
| 2020/0365667 A1* | 11/2020 | Jo | H10K 59/00 |
| 2021/0013265 A1* | 1/2021 | Hinata | H10K 59/38 |
| 2021/0124441 A1* | 4/2021 | Ding | H10K 59/40 |
| 2021/0233975 A1* | 7/2021 | Bouthinon | H10K 59/38 |
| 2022/0102430 A1* | 3/2022 | Yamazaki | H05B 33/14 |
| 2022/0285461 A1* | 9/2022 | Hatsumi | H10K 59/40 |

FOREIGN PATENT DOCUMENTS

| | | |
|---|---|---|
| CN | 110867468 A | 3/2020 |
| KR | 1020170037344 A | 4/2017 |
| KR | 101968803 B1 | 4/2019 |
| KR | 102126334 B1 | 6/2020 |
| KR | 1020200116363 A | 10/2020 |

OTHER PUBLICATIONS

Patric Buchele et al., "Space charge region effects in bidirectional illuminated P3HT:PCBM bulk heterojunction photodetectors," Organic Electronics, 2015, pp. 29-34, Elsevier B.V.

Taisuke Kamada et al., "OLED display incorporating organic photodiodes for fingerprint imaging," J Soc Inf Display, 2019, pp. 1-11, published by Wiley Periodicals, Inc.

* cited by examiner

DISPLAY APPARATUS

This application claims priority to Korean Patent Application No. 10-2021-0033595, filed on Mar. 15, 2021, and all the benefits accruing therefrom under 35 U.S.C. § 119, the content of which in its entirety is herein incorporated by reference.

BACKGROUND

1. Field

One or more embodiments relate to display apparatuses, and more particularly, to display apparatuses including photodetector diodes.

2. Description of the Related Art

The uses of a display apparatus have been diversified. Furthermore, as the display apparatus becomes thinner and lighter, the range of use thereof has become wider.

Along with an increase in an area occupied by the display area in the display apparatus, various functions applied or linked to the display apparatus are added to the display area. As a method to add various functions to an expanded display area, research on the display apparatus having an area for performing various functions as well as an image display inside the display area continues.

SUMMARY

As a display apparatus according to the related art includes a photodetector diode, the area of a light-emitting area is decreased or the sensing sensitivity of the photodetector diode is deteriorated.

One or more embodiments include display apparatuses including photodetector diodes that are arranged to reduce a decrease of the area of a light-emitting area and have improved sensing sensitivity. However, this is exemplary, and the scope of one or more embodiments according to the invention is not limited thereto.

Additional aspects will be set forth in part in the description which follows and, in part, will be apparent from the description, or may be learned by practice of the presented embodiments of the disclosure.

According to one or more embodiments, a display apparatus includes: a first unit pixel including a plurality of light-emitting diodes, and a second unit pixel including a plurality of light-emitting diodes and a photodetector diode, where each of the plurality of light-emitting diodes includes a first electrode, a second electrode facing the first electrode, and an emission layer disposed between the first electrode and the second electrode, and the photodetector diode includes a third electrode, a fourth electrode facing the third electrode, an active layer disposed between the third electrode and the fourth electrode, and a color filter layer disposed between the fourth electrode and the active layer.

According to an embodiment, the second unit pixel may include a second-1 unit pixel and a second-2 unit pixel, the color filter layer of the photodetector diode of the second-1 unit pixel may include a first-color color filter layer which transmits only light of a wavelength belonging to a first wavelength band, and the color filter layer of the photodetector diode of the second-2 unit pixel may include a second-color color filter layer which transmits only light of a wavelength belonging to a second wavelength band.

According to an embodiment, the first wavelength band may be about 630 nanometers (nm) to about 850 nm, and the second wavelength band may be about 495 nm to about 570 nm.

According to an embodiment, an area of the first unit pixel may be the same as an area of the second unit pixel, in a plan view.

According to an embodiment, each of the first unit pixel and the second unit pixel may include a first-color light-emitting area, a second-color light-emitting area, and a third-color light-emitting area, and in the plan view, an area of the second-color light-emitting area of the first unit pixel may be greater than an area of the second-color light-emitting area of the second unit pixel.

According to an embodiment, the active layer may include a bulk heterojunction ("BHJ") structure.

According to an embodiment, the first electrode and the third electrode may be disposed in the same layer and may include the same material, and the second electrode and the fourth electrode may be disposed in the same layer and may include the same material.

According to an embodiment, the second electrode and the fourth electrode may be integrally provided.

According to an embodiment, each of the plurality of light-emitting diodes may include at least one of a first common layer disposed between the first electrode and the emission layer and a second common layer disposed between the second electrode and the emission layer, and the photodetector diode may include at least one of a third common layer disposed between the third electrode and the active layer and a fourth common layer disposed between the fourth electrode and the active layer.

According to an embodiment, the first common layer and the third common layer may be integrally provided, and the second common layer and the fourth common layer may be integrally provided.

According to one or more embodiments, a display apparatus includes a first unit pixel including a plurality of light-emitting diodes, and a second unit pixel including a plurality of light-emitting diodes and a photodetector diode, wherein each of the plurality of light-emitting diodes includes a first electrode, a second electrode facing the first electrode, and an emission layer disposed between the first electrode and the second electrode, and the photodetector diode includes a third electrode, a fourth electrode facing the third electrode, an active layer disposed between the third electrode and the fourth electrode, and a color filter layer disposed on the fourth electrode.

According to an embodiment, the second unit pixel may include a second-1 unit pixel and a second-2 unit pixel, the color filter layer of the photodetector diode of the second-1 unit pixel may include a first-color color filter layer which transmits only light of a wavelength belonging to a first wavelength band, and the color filter layer of the photodetector diode of the second-2 unit pixel may include a second-color color filter layer which transmits only light of a wavelength belonging to a second wavelength band.

According to an embodiment, the first wavelength band may be about 630 nm to about 850 nm, and the second wavelength band may be about 495 nm to about 570 nm.

According to an embodiment, an area of the first unit pixel may be the same as an area of the second unit pixel, in a plan view.

According to an embodiment, each of the first unit pixel and the second unit pixel may include a first-color light-emitting area, a second-color light-emitting area, and a third-color light-emitting area, and in the plan view, an area of the second-color light-emitting area of the first unit pixel may be greater than an area of the second-color light-emitting area of the second unit pixel.

According to an embodiment, the active layer may include a bulk heterojunction (BHJ) structure.

According to an embodiment, the first electrode and the third electrode may be disposed in the same layer and may include the same material, and the second electrode and the fourth electrode may be disposed in the same layer and may include the same material.

According to an embodiment, the second electrode and the fourth electrode may be integrally provided.

According to an embodiment, each of the plurality of light-emitting diodes may include at least one of a first common layer disposed between the first electrode and the emission layer and a second common layer disposed between the second electrode and the emission layer, and the photodetector diode may include at least one of a third common layer disposed between the third electrode and the active layer and a fourth common layer disposed between the fourth electrode and the active layer.

According to an embodiment, the first common layer and the third common layer may be integrally provided, and the second common layer and the fourth common layer may be integrally provided.

Other aspects, features, and advantages than those described above will become apparent from the following drawings, claims, and detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
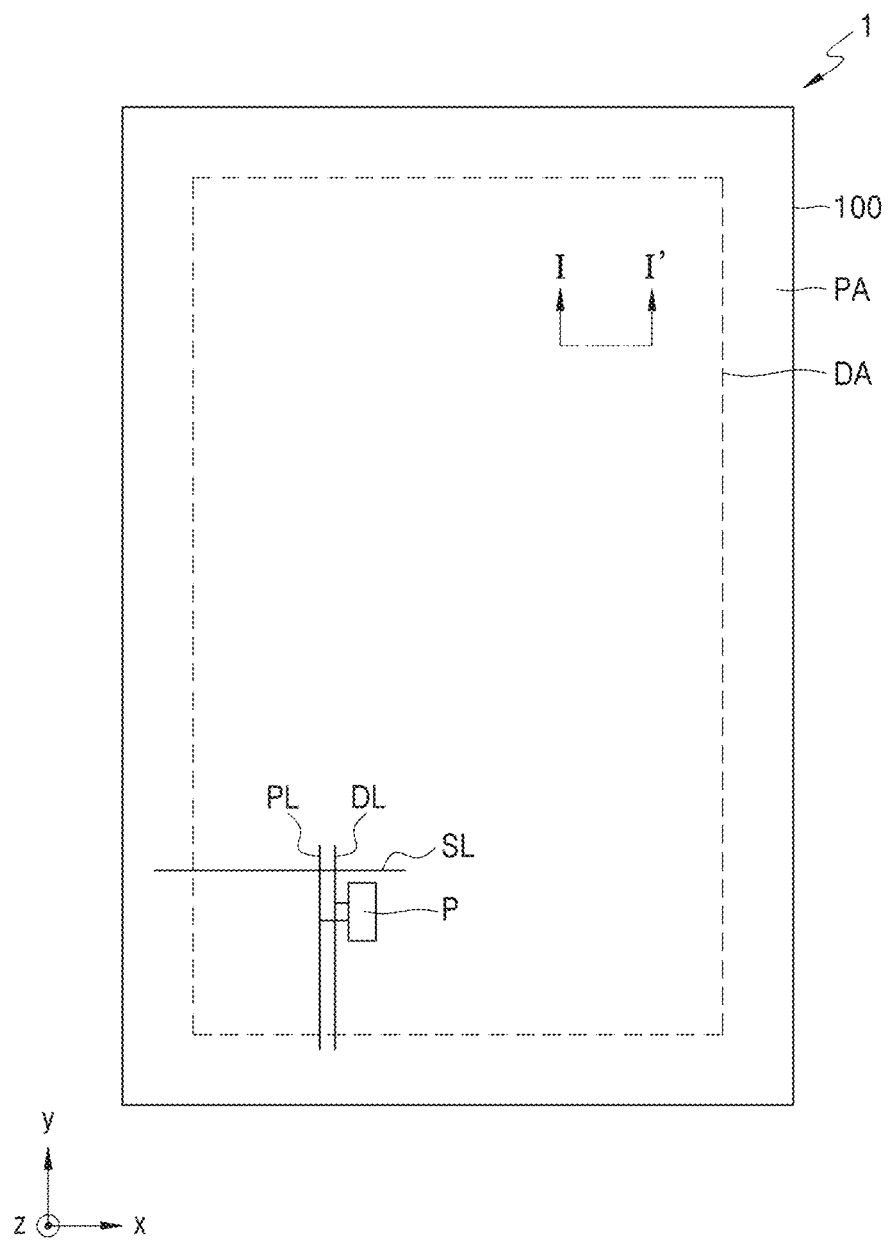
FIG. 1 is a schematic plan view of a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may, however, be embodied in many different forms and should not be construed as being limited to the embodiments set forth herein. Advantages and features of the disclosure and methods of accomplishing the same may be understood more readily by reference to the following detailed description of exemplary embodiments and the accompanying drawings. Rather, these embodiments are provided so that this disclosure will be thorough and complete and will fully convey the concept of the disclosure to those skilled in the art, and the disclosure will only be defined by the appended claims.

In embodiments described below, terms such as "first" and "second" are used herein merely to describe a variety of constituent elements, but the constituent elements are not limited by the terms. Such terms are used only for the purpose of distinguishing one constituent element from another constituent element.

In embodiments described below, an expression used in the singular encompasses the expression of the plural, unless it has a clearly different meaning in the context.

In embodiments described below, it will be further understood that the terms "comprises" and/or "comprising" used herein specify the presence of stated features or components, but do not preclude the presence or addition of one or more other features or components.

In embodiments described below, it will be understood that when a layer, region, or component is referred to as being "formed on" or "disposed on" another layer, region, or component, it can be directly or indirectly formed or disposed on the other layer, region, or component. That is, for example, intervening layers, regions, or components may be present.

In the drawings, sizes of components in the drawings may be exaggerated for convenience of explanation. For example, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the expression such as "A and/or B" may include A, B, or A and B. The expression such as "at least one of A and B" may include A, B, or A and B.

In embodiments described below, It will be understood that when a layer, region, or component is referred to as being "connected to" another layer, region, or component, it can be directly connected to the other layer, region, or component or indirectly connected to the other layer, region, or component via intervening layers, regions, or components. For example, in the specification, when a layer, region, or component is referred to as being electrically connected to another layer, region, or component, it can be directly electrically connected to the other layer, region, or component or indirectly electrically connected to the other layer, region, or component via intervening layers, regions, or components.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, the disclosure will be described in detail by explaining preferred embodiments of the disclosure with reference to the attached drawings, and the same or corresponding constituents are indicated by the same reference numerals and redundant descriptions thereof are omitted.

FIG. 1 is a schematic plan view of a portion of a display apparatus 1 according to an embodiment.

As illustrated in FIG. 1, the display apparatus 1 according to an embodiment may include a display area DA that emits light and a peripheral area PA that does not emit light. The display apparatus 1 may include a substrate 100 that may include an area corresponding to the display area DA and an area corresponding to the peripheral area PA.

In the display area DA, a unit pixel P may be disposed at an intersection of a scan line SL extending in an x-axis direction and a data line DL extending in a y-axis direction. Each unit pixel P may include a pixel circuit connected to the scan line SL and the data line DL and a display element connected to the pixel circuit. The unit pixel P may denote a unit pixel having a plurality of subpixels (SP, see FIG. 5). Each unit pixel P provided in the display apparatus 1 may include a light-emitting diode as a display element capable of emitting light of a certain color. In detail, each of subpixels SP of the unit pixel P may include a light-emitting diode.

Although FIG. 1 illustrates the display apparatus 1 having the display area DA that is rectangular, the shape of the display area DA may be circular, oval, polygonal, or the like.

The peripheral area PA may surround at least a part of the display area DA. For example, the peripheral area PA may surround the display area DA as a whole. Various wiring/interconnections for transmitting electrical signals to the display area DA may be disposed in the peripheral area PA. Furthermore, a part of a circuit portion to control electrical signals applied to the display area DA may be disposed in the peripheral area PA.

The peripheral area PA may include a pad area (not shown) at one side thereof. A pad portion including a plurality of pads may be arranged in the pad area. The pads included in the pad portion may be electrically connected to the pads of a printed circuit board, respectively, so as to receive signals input through the printed circuit board. To this end, the pad portion may include a plurality of pads. The pads may be exposed, not being covered with an insulating layer, to be electrically connected to the printed circuit board, or the like.

Figure 2:
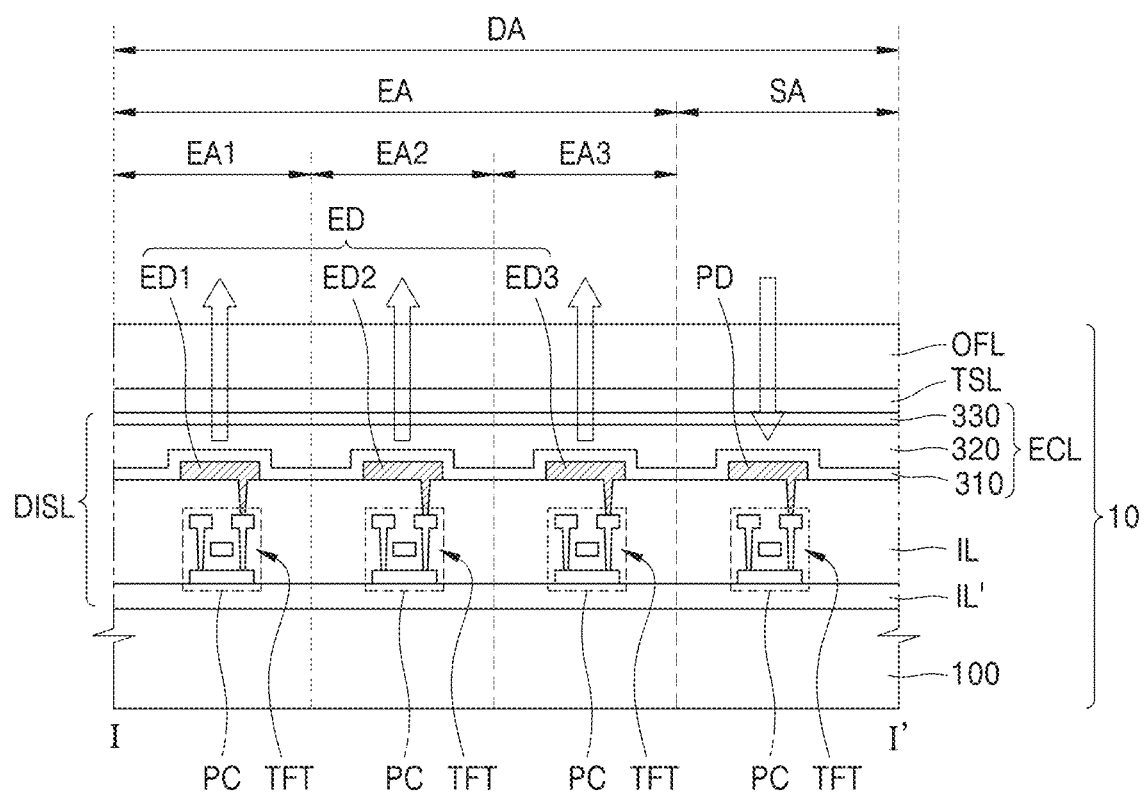
FIG. 2 is a schematic cross-sectional view of a portion of a display panel of a display apparatus according to an embodiment.

FIG. 2 is a schematic cross-sectional view of a portion of a display panel 10 of the display apparatus 1, according to an embodiment. FIG. 2 corresponds to a cross-sectional view of the display panel 10 taken along line I-I' of FIG. 1.

As illustrated in FIG. 2, the display area DA of the display panel 10 may include a light-emitting area EA and a sensing area SA. The substrate 100 of the display panel 10 may have an area corresponding to the light-emitting area EA and an area corresponding to the sensing area SA.

The light-emitting area EA is an area where a light-emitting diode ED is arranged to emit light to the outside. In an embodiment, the light-emitting area EA may include a first-color light-emitting area EA1 for emitting first color light, a second-color light-emitting area EA2 for emitting second color light, and a third-color light-emitting area EA3 for emitting third color light. The first color, the second color, and third color may be blue, green, and red, respectively, but the disclosure according to the invention is not limited thereto. For example, the first color, the second color, and the third color may be red, green, and blue, respectively, and various modifications are available.

The sensing area SA may be an area where a photodetector diode PD is arranged to sense light input thereto. In an embodiment, the sensing area SA may be optionally provided in an area for performing a sensing function in the display area DA. For example, the sensing area SA may include an area for sensing an object in a contact state, an area for sensing an object in a non-contact state, an area for sensing biometric information, or the like.

The display panel 10 may include the substrate 100 and a display layer DISL, a touchscreen layer TSL, and an optical function layer OFL, which are on the substrate 100.

The substrate 100 may include various materials such as glass, metal, or an organic material. In an embodiment, the substrate 100 may include a flexible material. For example, the substrate 100 may include ultrathin flexible glass, for example, having a thickness of several tens to hundreds of micrometers, or polymer resin. When the substrate 100 includes polymer resin, the substrate 100 may include polyimide. Alternatively, the substrate 100 may include polyethersulfone, polyarylate, polyetherimide, polyethylene naphthalate, polyethylene terephthalate ("PET"), polyphenylene sulfide, polycarbonate, cellulose triacetate, cellulose acetate propionate, or/and the like.

The display layer DISL may be disposed on the substrate 100. The display layer DISL may include a circuit layer including pixel circuits PCs, a display element layer including light-emitting diodes EDs and photodetector diodes PDs, and an encapsulation layer ECL covering the display element layer. Insulating layers IL and IL' may be arranged between the substrate 100 and the display layer DISL and inside the display layer DISL.

Some of the pixel circuits PCs of the circuit layer may be electrically connected to the light-emitting diode ED, and the other of the pixel circuits PCs may be electrically connected to the photodetector diode PD. Each of the pixel circuits PCs may include at least one thin film transistor TFT. The electrical connection of the pixel circuit PC to the light-emitting diode ED or the photodetector diode PD may be understood as that the thin film transistor TFT included in the pixel circuit PC is electrically connected to the light-emitting diode ED or the photodetector diode PD. The thin film transistor TFT electrically connected to the light-emitting diode ED may control light-emission of the light-emitting area EA, and the thin film transistor TFT electrically connected to the photodetector diode PD may control sensing of the sensing area SA.

The light-emitting diodes EDs of the display element layer may be arranged corresponding to the light-emitting areas EAs. In an embodiment, the light-emitting diode ED may include a first light-emitting diode ED1 corresponding to the first-color light-emitting area EA1, a second light-emitting diode ED2 corresponding to the second-color light-emitting area EA2, and a third light-emitting diode ED3 corresponding to the third-color light-emitting area EA3.

The light-emitting diode ED may include an organic light-emitting diode, an inorganic light-emitting diode, a micro LED, or a quantum-dot emitting diode. In the following description, for convenience of explanation, a case in which the light-emitting diode ED includes an organic light-emitting diode is described as an example.

The light-emitting diode ED and the photodetector diode PD may be covered and protected by the encapsulation layer ECL. An encapsulation layer ECL may prevent the light-emitting diode ED and the photodetector diode PD from being damage by external moisture, oxygen, or the like. In an embodiment, the encapsulation layer ECL may include at least one an organic encapsulation layer and at least one inorganic encapsulation layer. For example, the encapsulation layer ECL may include a first inorganic encapsulation layer 310, an organic encapsulation layer 320, and a second inorganic encapsulation layer 330.

The first inorganic encapsulation layer 310 and the second inorganic encapsulation layer 330 may include a silicon oxide, a silicon nitride, and/or a silicon trioxynitride, or the like. As the first inorganic encapsulation layer 310 is disposed along a structure thereunder, an upper surface thereof is not flat, and thus the organic encapsulation layer 320 is disposed to cover the first inorganic encapsulation layer 310 so that the upper surface is made flat. The organic encapsulation layer 320 may include one or more materials selected from the group consisting of polyethylene terephthalate, polyethylene naphthalate, polycarbonate, polyimide, polyethylene sulfonate, polyoxymethylene, polyarylate, and hexamethyldisiloxane.

The touchscreen layer TSL may obtain coordinates information according to an external input, for example, a touch event. The touchscreen layer TSL may include a touch electrode and touch wiring/interconnections connected to the touch electrode. The touchscreen layer TSL may sense an external input in a self-capacitance method or a mutual capacitance method.

The touchscreen layer TSL may be disposed on the encapsulation layer ECL. Alternatively, the touchscreen layer TSL may be coupled to the encapsulation layer ECL through an adhesive layer such as an optically clear adhesive ("OCA") after being separately disposed on a touch substrate. In an embodiment, the touchscreen layer TSL may be disposed directly on the encapsulation layer ECL. In this case, the adhesive layer may not be provided between the touchscreen layer TSL and the encapsulation layer ECL.

The optical function layer OFL may include an antireflection layer. The antireflection layer may reduce reflectively of light (external light) input to the display apparatus 1 from the outside. In an embodiment, the optical function layer OFL may be a polarized film. In another embodiment, the optical function layer OFL may be provided as a filter plate including a black matrix and color filters.

The light-emitting diode ED and the photodetector diode PD may be applied to various electronic devices and/or display apparatuses. An electronic device and/or a display apparatus having the light-emitting diode ED and the photodetector diode PD, as a device for displaying a video or a still image, may be used as a display screen of not only portable electronic device such as mobile phones, smart phones, tablet personal computers ("PCs"), mobile communication terminals, electronic notebooks, electronic books, portable multimedia players ("PMPs"), navigation devices, ultra-mobile PCs ("UMPCs"), or the like, but also various product such as televisions, notebook computers, monitors, billboards, internet of things ("IOT"), or the like. Furthermore, the electronic device and/or display apparatus having the light-emitting diode ED and the photodetector diode PD may be used for wearable devices such as smart watches, watch phones, glasses type displays, and head mounted displays ("HMDs"). Furthermore, the electronic device and/or display apparatus having the light-emitting diode ED and the photodetector diode PD may be used as a display for instrument panels of cars, center information displays ("CIDs") placed on center fascia or dashboards of cars, room mirror displays replacing side mirrors of cars, entertainment for rear seats of cars, which is arranged on the back of the front seats.

Figure 3A:
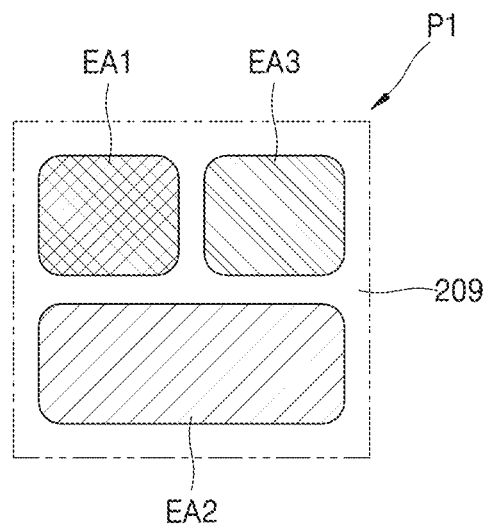
FIG. 3A is a schematic plan view of a first unit pixel according to an embodiment.
Figure 3B:
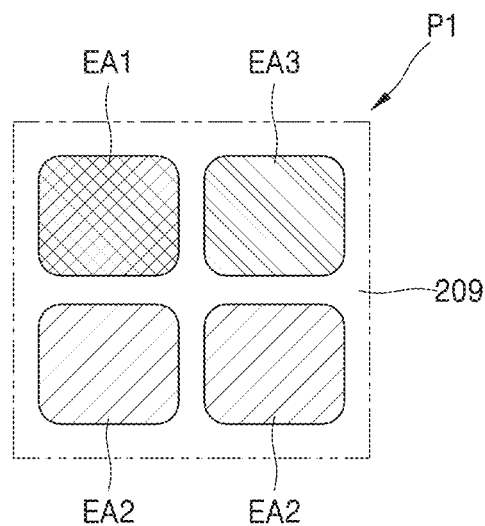
FIG. 3B is a schematic plan view of a first unit pixel according to another embodiment.
Figure 4:
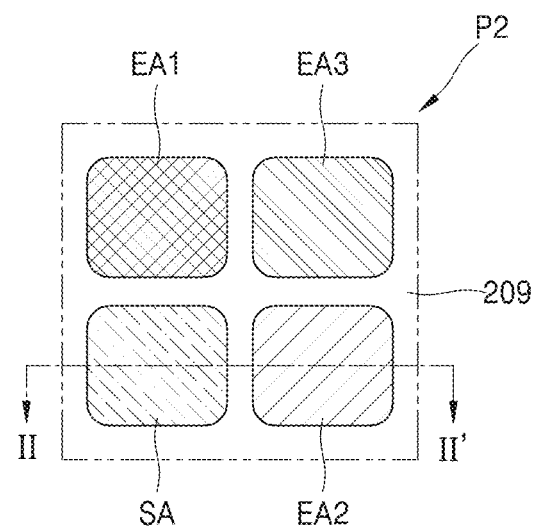
FIG. 4 is a schematic plan view of a second unit pixel according to an embodiment.

FIGS. 3A and 3B are schematic plan views of a first unit pixel according to some embodiments, and FIG. 4 is a schematic plan view of a second unit pixel according to an embodiment.

A plurality of unit pixels P of FIG. 1 are arranged on the substrate 100 of FIG. 1 included in the display apparatus 1. A unit pixel P may include a first unit pixel P1 and a second unit pixel P2. The first unit pixel P1 may be a unit pixel that includes the light-emitting areas EAs and does not include the sensing area SA, and the second unit pixel P2 is a unit pixel that include the light-emitting areas EAs and the sensing area SA together. In an embodiment, the area of the first unit pixel P1 and the area of the second unit pixel P2 may be the same in a plan view.

Referring to FIGS. 3A and 3B, the first unit pixel P1 may include a plurality of subpixels. The area of the subpixels may be defined by the area of the light-emitting area EA included in each subpixel. Furthermore, each of the light-emitting areas may be defined by a pixel opening of a pixel definition layer 209. In detail, the pixel definition layer 209 may be arranged to entirely cover the substrate 100 in a plan view and define a pixel opening overlapping the light-emitting areas, thereby defining the light-emitting areas. In an embodiment, the first unit pixel P1 may include the first-color light-emitting area EA1, the second-color light-emitting area EA2, and the third-color light-emitting area EA3. The pixel definition layer 209 may define pixel openings overlapping the first-color light-emitting area EA1, the second-color light-emitting area EA2, and the third-color light-emitting area EA3, respectively.

Referring to FIG. 4, the second unit pixel P2 may include a plurality of subpixels and a sensing portion. The area of the subpixels may be defined by the area of the light-emitting area EA included in each subpixel, and the area of the sensing portion may be defined by the area of the sensing area SA included in the sensing portion. In detail, the pixel definition layer 209 may be arranged to entirely cover the substrate 100 in a plan view and may define pixel openings overlapping the light-emitting areas, respectively, thereby defining the light-emitting areas. In an embodiment, the second unit pixel P2 may include the first-color light-emitting area EA1, the second-color light-emitting area EA2, the third-color light-emitting area EA3, and the sensing area SA. The pixel definition layer 209 may define pixel openings overlapping the first-color light-emitting area EA1, the second-color light-emitting area EA2, the third-color light-emitting area EA3, and the sensing area SA, respectively.

The shapes of the light-emitting area EA of the subpixel and the sensing area SA of the sensing portion may be variously modified. In this regard, FIGS. 3A to 4 illustrate a case in which the light-emitting area EA of the subpixel and the sensing area SA of the sensing portion each have a rounded rectangular shape, but the disclosure according to the invention is not limited thereto. The light-emitting area EA of the subpixel and the sensing area SA of the sensing portion may have a shape such as a circular shape, an oval shape, a polygonal shape, a rounded polygonal shape, or the like, in another embodiment.

Furthermore, there is no limitation in the arrangement of subpixels and sensing portions, that is, the light-emitting area EA and the sensing area SA. For example, the light-emitting area EA and the sensing area SA may be arranged in various structures such as a stripe structure, a pentile structure, a mosaic structure, a delta structure, or the like.

Furthermore, the area of the light-emitting area EA and the area of the sensing area SA may be variously modified. For example, as illustrated in FIGS. 3A and 3B, in the area of the first unit pixel P1, the area of the second-color light-emitting area EA2 may be relatively large compared with the area of the first-color light-emitting area EA1 and the area of the third-color light-emitting area EA3. In this state, the second-color light-emitting area EA2 that is relatively large may be provided as one light-emitting area as illustrated in FIG. 3A, or as two light-emitting areas as illustrated in FIG. 3B. A relation in size of the areas of the first-color light-emitting area EA1, the second-color light-emitting area EA2, and the third-color light-emitting area EA3 may be variously modified.

In the second unit pixel P2, a space for arranging the sensing area SA may be secured by reducing the area of a light-emitting area that is provided to be relatively large in the first unit pixel P1. In a detailed example, as illustrated in FIG. 3B, the first unit pixel P1 may include the second-color light-emitting areas EA2s that occupy a relatively large area compared with other light-emitting areas and are provided as two light-emitting areas. Referring to FIG. 4, the second unit pixel P2 may include only one second-color light-emitting area EA2 of the two second-color light-emitting areas EA2s in the first unit pixel P1, and the sensing area SA, instead of the second-color light-emitting area EA2, may be provided in the space occupied by the other of the second-color light-emitting areas EA2s in FIG. 3B. In this case, the area of the second-color light-emitting area EA2 of the second unit pixel P2 may be smaller than the area of the second-color light-emitting area EA2 of the first unit pixel P1 in a plan view.

As such, without having to secure a separate space for arrangement of the sensing area SA, the light-emitting areas EAs and the sensing area SA may be simultaneously provided in the unit pixel of the same area. Furthermore, since the second unit pixel P2 including the sensing area SA may be optionally arranged in a portion for performing a sensing function in the display area DA of FIG. 1, as described above, the reduction of the area of the light-emitting area EA and the generation of a dead space due to the arrangement of the sensing area SA may be effectively reduced.

Figure 5:
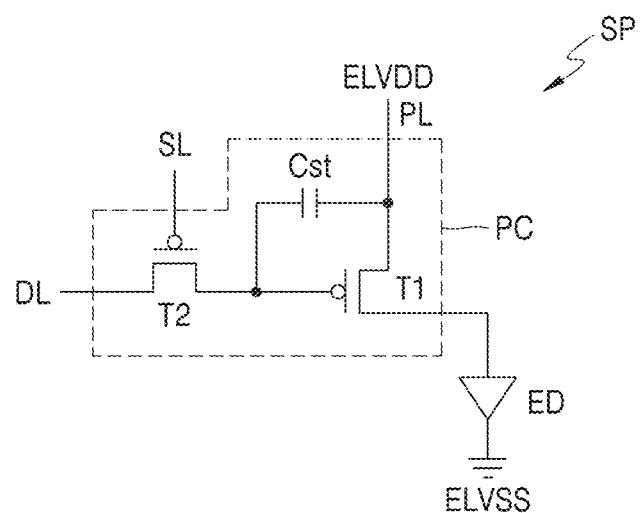
FIG. 5 is an equivalent circuit diagram of any one subpixel according to an embodiment.

FIG. 5 is an equivalent circuit diagram of any one subpixel according to an embodiment.

Each of the subpixels SP included in the unit pixel P of FIG. 1 according to an embodiment may include the pixel circuit PC and the light-emitting diode ED connected to the pixel circuit PC.

The pixel circuit PC may include a first thin film transistor T1, a second thin film transistor T2, and a storage capacitor Cst. Each subpixel SP may emit, for example, red, green, or blue light or red, green, blue, or white light through the light-emitting diode ED.

The second thin film transistor T2, as a switching thin film transistor, may be connected to the scan line SL and the data line DL, and may transmit a data voltage input through the data line DL to the first thin film transistor T1 according to a switching voltage input through the scan line SL. The storage capacitor Cst may be connected to the second thin film transistor T2 and a driving voltage line PL, and may store a voltage corresponding to a difference between the voltage received from the second thin film transistor T2 and a first power voltage ELVDD supplied to the driving voltage line PL.

The first thin film transistor T1, as a driving thin film transistor, may be connected to the driving voltage line PL and the storage capacitor Cst, and may control a driving current flowing from the driving voltage line PL in the light-emitting diode ED corresponding to a voltage value stored in the storage capacitor Cst. The light-emitting diode ED may emit light having a certain luminance by the driving current. A second electrode, for example, a cathode of the light-emitting diode ED may receive a second power voltage ELVSS.

Although FIG. 5 illustrates that the pixel circuit PC includes two thin film transistors T1 and T2 and one storage capacitor Cst, the disclosure according to the invention is not limited thereto. In other words, the number of thin film transistors and the number of capacitors, both being included in the pixel circuit PC, may be variously changed according to the design of the pixel circuit PC. For example, the pixel circuit PC may further include four, five, or more thin film transistors in addition to the above-described two thin film transistors. Furthermore, one or more capacitor may be further included in addition to the above-described storage capacitor Cst.

Figure 6:
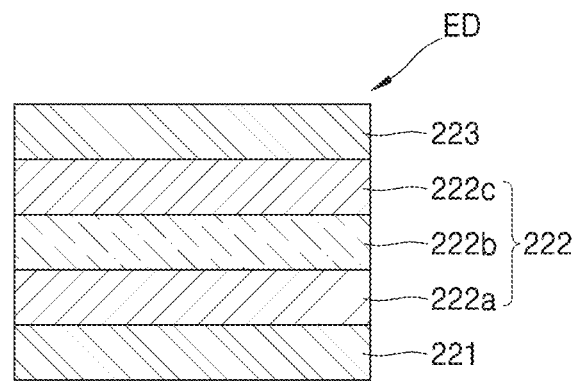
FIG. 6 is a schematic cross-sectional view of a light-emitting diode according to an embodiment.

FIG. 6 is a schematic cross-sectional view of a light-emitting diode according to an embodiment.

As illustrated in FIG. 6, the light-emitting diode ED according to an embodiment may include a first electrode 221, a second electrode 223, and an intermediate layer 222 disposed between the first electrode 221 and the second electrode 223.

The first electrode 221 of the light-emitting diode ED may be a reflective electrode, a semi-reflective electrode, or a transmissive electrode. In an embodiment, the first electrode 221 may include a reflective film including Ag, Mg, Al, Pt, Pd, Au, Ni, Nd, Ir, Cr, and a compound thereof, and a transparent or semi-transparent electrode layer disposed on the reflective film. The transparent or semi-transparent electrode layer may include at least one selected from the group consisting of indium tin oxide ("ITO"), indium zinc oxide ("IZO"), zinc oxide (ZnO), indium oxide ($In_2O_3$), indium gallium oxide ("IGO") and aluminum zinc oxide ("AZO").

Furthermore, the first electrode 221 may have a single layer structure having a single layer, or a multilayer structure having a plurality of layers stacked on each other. For example, the first electrode 221 may have a multilayer structure including ITO layers and a metal layer provided therebetween. In a detailed example, the first electrode 221 may have a tri-layered structure of ITO layer/Ag layer/ITO layer.

The second electrode 223 of the light-emitting diode ED may include a translucent electrode or a reflective electrode. In some embodiments, the second electrode 223 may include a transparent or semi-transparent electrode, and may include a metal thin film having a small work function and including Li, Ca, LiF/Ca, LiF/Al, Al, Ag, Mg, or a compound thereof. Furthermore, the second electrode 223 may further include a transparent conductive oxide ("TCO") film such as ITO, IZO, ZnO, or $In_2O_3$, in addition to the metal thin film.

The intermediate layer 222 of the light-emitting diode ED, as a layer provided between the first electrode 221 and the second electrode 223, may include a single layer and/or a plurality of layers provided between the first electrode 221 and the second electrode 223. The layers included in the intermediate layer 222 may include an organic material, but the disclosure according to the invention is not limited thereto. Furthermore, the intermediate layer 222 may further include, in addition to various organic materials, a metal-containing compound such as an organic metal compound, an inorganic material such as quantum dots, or the like.

The intermediate layer 222 may include an emission layer 222b. The emission layer 222b may include an organic material including a fluorescent or phosphorescent material that emits red, green, blue, or white light. The emission layer 222b may include an organic emission layer including a low molecular weight organic material or a polymer organic material. For example, the emission layer 222b, as an organic emission layer, may include copper phthalocyanine, tris-8-hydroxyquinoline aluminum, a poly-phenylene vinylene ("PPV")-based material, or a polyfluorene-based material.

In an embodiment, the emission layer 222b may include a host material and a dopant material. The dopant material, as a material for emitting light of a specific color, may include a light-emitting material. The light-emitting material may include at least one of a phosphorescent dopant, a fluorescent dopant, or a quantum dot. The host material, as a main material of the emission layer 222b, may include a material that helps the dopant material emit light.

The intermediate layer 222 may further include a hole transport region provided between the first electrode 221 and the emission layer 222b and an electron transport region provided between the emission layer 222b and the second electrode 223.

The hole transport region may have a single layer structure having a single layer including a single material, a single layer structure having a single layer including a plurality of materials different from each other, or a multi-layer structure having a plurality of layers including materials different from each other. A first common layer 222a may be arranged in the hole transport region.

The first common layer 222a may include at least one of a hole injection layer ("HIL"), a hole transport layer ("HTL"), or an electron blocking layer ("EBL").

For example, the first common layer 222a may have a single layer structure having a single layer, or a multilayer structure having HIL/HTL, HIL/EBL, HTL/EBL, HIL/HTL/EBL, or the like, which are sequentially stacked on the first electrode 221, but the disclosure according to the invention is not limited thereto.

The first common layer 222a may include at least one of m-MTDATA, TDATA, 2-TNATA, NPB("NPD"), β-NPB, TPD, Spiro-TPD, Spiro-NPB, methylated-NPB, TAPC, HMTPD, TCTA (4,4',4"-tris(N-carbazolyl)triphenylamine), Pani/DBSA (polyaniline/dodecylbenzenesulfonic acid), Pani/CSA (polyaniline/camphor sulfonic acid), PEDOT/PSS (poly(3,4-ethylenedioxythiophene)/poly(4-styrene-sulfonate)), or PANI/PSS (polyaniline/poly(4-styrene-sulfonate)).

The electron transport region may have a single layer structure having a single layer including a single material, a single layer structure having a single layer including a plurality of materials different from each other, or a multi-layer structure having a plurality of layers including materials different from each other. A second common layer 222c may be arranged in the electron transport region.

The second common layer 222c may include at least one of an electron injection layer (EIL), an electron transport layer (ETL), or a hole blocking layer ("HBL").

For example, the second common layer 222c may have a single layer structure having a single layer, or a multilayer structure of ETL/EIL, HBL/EIL, HBL/ETL, HBL/ETL/EIL, or the like, which are sequentially stacked on the emission layer 222b, but the disclosure according to the invention is not limited thereto.

The second common layer 222c may include at least one compound of BCP (2,9-Dimethyl-4,7-diphenyl-1,10-phenanthroline), Bphen (4,7-Diphenyl-1,10-phenanthroline), $Alq_3$, BAlq, TAZ (3-(Biphenyl-4-yl)-5-(4-tert-butylphenyl)-4-phenyl-4H-1,2,4-triazole), or NTAZ.

The intermediate layer 222 of the light-emitting diode ED may be formed by a vacuum deposition method, screen print, an inkjet print method, laser induced thermal imaging ("LITI"), or the like, but the disclosure according to the invention is not limited thereto.

Figure 7A:
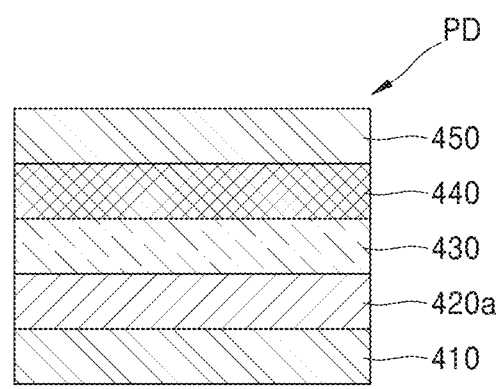
FIG. 7A is a schematic cross-sectional view of a photodetector diode according to an embodiment.
Figure 7B:
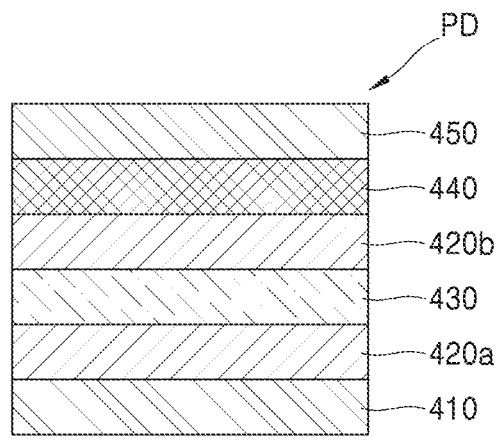
FIG. 7B is a schematic cross-sectional view of a photodetector diode according to another embodiment.
Figure 7C:
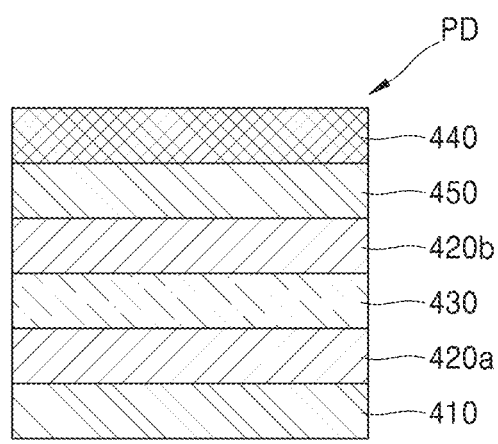
FIG. 7C is a schematic cross-sectional view of a photodetector diode according to another embodiment.

FIG. 7A to FIG. 7C are schematic cross-sectional views of a photodetector diode PD according to some embodiments.

As illustrated in FIGS. 7A and 7B, the photodetector diode PD according to an embodiment may include a third electrode 410, a fourth electrode 450, an active layer 430 provided between the third electrode 410 and the fourth electrode 450, and a color filter layer 440 provided between the fourth electrode 450 and the active layer 430.

The third electrode 410 of the photodetector diode PD may be disposed in the same layer as and may include the same material as the first electrode 221 of the light-emitting diode ED. For example, the third electrode 410 may include a reflective electrode, a semi-reflective electrode, or a transmissive electrode. In an embodiment, the third electrode 410 may include a reflective film including Ag, Mg, Al, Pt, Pd, Au, Ni, Nd, Ir, Cr and a compound thereof, and a transparent or semi-transparent electrode layer disposed on the reflective film. The transparent or semi-transparent electrode layer may include at least one selected from the group consisting of ITO, IZO, ZnO, $In_2O_3$, IGO, and AZO.

Furthermore, the third electrode 410 may have a single layer structure having a single layer, or a multilayer structure having a plurality of layers stacked on each other. For example, the third electrode 410 may have a multilayer structure including ITO layers and a metal layer provided therebetween. In a detailed example, the third electrode 410 may have a tri-layered structure of ITO layer/Ag layer/ITO layer.

The fourth electrode 450 of the photodetector diode PD may be disposed in the same layer as and may include the same material as the second electrode 223 of the light-emitting diode ED. Furthermore, the fourth electrode 450 of the photodetector diode PD and the second electrode 223 of the light-emitting diode ED may be integrally provided.

In an embodiment, for example, the fourth electrode 450 may include a translucent electrode or a reflective electrode. In some embodiments, the fourth electrode 450 may include a transparent or semi-transparent electrode, and include a metal thin film having a small work function and including Li, Ca, LiF/Ca, LiF/Al, Al, Ag, Mg, or a compound thereof. Furthermore, the fourth electrode 450 may further include a TCO film such as ITO, IZO, ZnO, or $In_2O_3$, in addition to the metal thin film.

The active layer 430 of the photodetector diode PD is a layer that generates excitons by receiving light from the outside, and then separates the generated excitons into holes and electrons. The active layer 430 may include a bulk heterojunction (BHJ) structure. In detail, the active layer 430 may include a p-type organic semiconductor and an n-type organic semiconductor.

In an embodiment, the active layer 430 may include a p-type semiconductor layer including the p-type organic semiconductor and an n-type semiconductor layer including the n-type organic semiconductor, and the p-type semiconductor layer and the n-type semiconductor layer may form a PN junction.

The p-type organic semiconductor may function as an electron donor, and the n-type organic semiconductor may function as an electron acceptor. Accordingly, the excitons may be efficiently separated into holes and electrons due to photo-induced charge separation generated at an interface between these layers. In addition, as the active layer 430 is separated into the p-type semiconductor layer and the n-type semiconductor layer, the holes and electrons generated at the interface may be easily captured and moved.

In another embodiment, the active layer 430 may include a mixed layer in which the p-type organic semiconductor and the n-type organic semiconductor are mixed with each other. In this case, the active layer 430 may be formed by co-depositing the p-type organic semiconductor and the n-type organic semiconductor. When the active layer 430 is a mixed layer, the excitons may be generated within a diffusion distance from a donor-acceptor interface, and thus external quantum efficiency of the photodetector diode PD may be improved.

The p-type organic semiconductor may include a compound serving as an electron door for supplying electrons. For example, the p-type organic semiconductor may include boron subphthalocyanine chloride (SubPc), copper(II) phthalocyanine (CuPc), or tetraphenyldibenzoperiflanthene ("DBP"), but the disclosure according to the invention is not limited thereto. Furthermore, the n-type organic semiconductor may include a compound serving as an electron acceptor for accepting electrons. For example, the n-type organic semiconductor may include C60 fullerene or C70 fullerene, but the disclosure according to the invention is not limited thereto.

A third common layer 420a may be arranged between the third electrode 410 of the photodetector diode PD and the active layer 430. The third common layer 420a may be disposed in the same layer as and may include the same material as the first common layer 222a of the light-emitting diode ED. Furthermore, the third common layer 420a of the photodetector diode PD and the first common layer 222a of the light-emitting diode ED may be integrally provided.

The third common layer 420a may include at least one of HIL, HTL, or EBL.

In an embodiment, for example, the third common layer 420a may have a single layer structure having a single layer, or a multilayer structure having HIL/HTL, HIL/EBL, HTL/EBL, HIL/HTL/EBL, or the like, which are sequentially stacked on the third electrode 410, but the disclosure according to the invention is not limited thereto.

The third common layer 420a may include at least one of m-MTDATA, TDATA, 2-TNATA, NPB(NPD), β-NPB, TPD, Spiro-TPD, Spiro-NPB, methylated-NPB, TAPC, HMTPD, TCTA, Pani/DBSA, Pani/CSA, PEDOT/PSS, or PANI/PSS.

As illustrated in FIG. 7B, the photodetector diode PD may further include a fourth common layer 420b between the fourth electrode 450 and the active layer 430. The fourth common layer 420b may be disposed in the same layer as and may include the same material as the second common layer 222c of the light-emitting diode ED. Furthermore, the fourth common layer 420b of the photodetector diode PD and the second common layer 222c of the light-emitting diode ED may be integrally provided.

The fourth common layer 420b may include at least one of EIL, ETL, or HBL.

In an embodiment, for example, the fourth common layer 420b may have a single layer structure having a single layer, or a multilayer structure of ETL/EIL, HBL/EIL, HBL/ETL, HBL/ETL/EIL, or the like, which are sequentially stacked on the active layer 430, but the disclosure according to the invention is not limited thereto.

The fourth common layer 420b may include at least one compound of BCP (2,9-Dimethyl-4,7-diphenyl-1,10-phenanthroline), Bphen (4,7-Diphenyl-1,10-phenanthroline), Alq$_3$, BAlq, TAZ (3-(Biphenyl-4-yl)-5-(4-tert-butylphenyl)-4-phenyl-4H-1,2,4-triazole), or NTAZ.

The color filter layer 440 of the photodetector diode PD is a layer that transmits light of a wavelength belonging to a preset wavelength band. Only light of a wavelength belonging to a specific wavelength band of the light input to the photodetector diode PD by the color filter layer 440 may arrive at the active layer 430, the sensing sensitivity of the photodetector diode PD may be improved. In detail, when the photodetector diode PD performs a certain function by recognizing light belonging to a first wavelength band, the color filter layer 440 may include a first-color color filter layer for transmitting only light of a wavelength belonging to a first wavelength band. Likewise, when the photodetector diode PD performs a certain function by recognizing light belonging to a second wavelength band or a third wavelength band, the color filter layer 440 may include a second-color color filter layer for transmitting only light belonging to a second wavelength band or a third-color color filter layer for transmitting only light belonging to a third wavelength band.

In an embodiment, the first wavelength band may be 630 nanometers (nm) to 850 nm, the second wavelength band may be 495 nm to 570 nm, and the third wavelength band may be 450 nm to 495 nm, but the disclosure according to the invention is not limited thereto. The wavelength band through which the color filter layer 440 allows light to optionally pass may be variously changed according to the type of a sensing function performed in the sensing area SA.

Furthermore, the wavelength band through which the color filter layer 440 allows light to optionally pass may differ according to the area where the photodetector diode PD is arranged. In detail, the second unit pixel P2 of FIG. 4 may include a second-1 unit pixel and a second-2 unit pixel, which are arranged in different areas in the display area DA. In this state, the color filter layer 440 of the photodetector diode PD arranged in the second-1 unit pixel and the color filter layer 440 of the photodetector diode PD arranged in the second-2 unit pixel may each allow only light of a wavelength belonging to a different wavelength band. For example, the photodetector diode PD arranged in the second-1 unit pixel may include the first-color color filter layer that transmits only light of a wavelength belonging to the first wavelength band, and the photodetector diode PD arranged in the second-2 unit pixel may include the second-color color filter layer that transmits only light of a wavelength belonging to the second wavelength band.

Accordingly, sensing areas performing different sensing functions may be provided in the display area DA, and an electronic device or a display apparatus including the sensing areas may perform a multi-sensing function. Furthermore, as the sensing areas performing different functions are formed by simply changing the color filter layer 440, efficiency of a process of forming sensing areas having different functions may be effectively improved. Various sensing functions to be performed by the photodetector diode PD are described below with reference to FIGS. 9A to 9C.

The color filter layer 440 may be arranged below or above the fourth electrode 450. In this connection, FIGS. 7A and 7B illustrates a case in which the color filter layer 440 is disposed between the fourth electrode 450 and the active layer 430 under the fourth electrode 450. In this case, the color filter layer 440 may be formed before the second electrode 223 of the light-emitting diode ED of FIG. 6 and the fourth electrode 450 of the photodetector diode PD are formed. FIG. 7C illustrates a case in which the color filter layer 440 is arranged on the fourth electrode 450. In this case, the color filter layer 440 may be formed after the second electrode 223 of the light-emitting diode ED and the fourth electrode 450 of the photodetector diode PD are formed.

The active layer 430 and/or the color filter layer 440 of the photodetector diode PD may be formed by using an inkjet process. Accordingly, as there is no need to perform a deposition process to form the photodetector diode PD in a separate unit pixel, efficiency of a process may be improved. In addition, the efficiency of a process of forming sensing areas having different functions may be improved by simply changing only the color filter layer 440 to form sensing areas performing different functions.

In detail, in a process of forming a unit pixel including the light-emitting diode ED and the photodetector diode PD, that is, a light-emitting area and a sensing area, among the configurations of the photodetector diode PD, configurations disposed in the same layer as and including the same material as the configuration of the light-emitting diode ED may be simultaneously formed in one process. For example, the third electrode 410, the fourth electrode 450, the third common layer 420a, and the fourth common layer 420b of the photodetector diode PD may be simultaneously formed in the process of forming the first electrode 221, the second electrode 223, the first common layer 222a, and the second common layer 222c of the light-emitting diode ED, respectively.

In contrast, among the configurations of the photodetector diode PD, configurations having different layer structure and material from the configuration of the light-emitting diode ED may be formed through an inkjet process, instead of a separate deposition process between operations of the process of forming the configurations of the light-emitting diode ED. For example, the active layer 430 and the color filter layer 440 of the photodetector diode PD may be formed through an inkjet process.

Figure 8A:
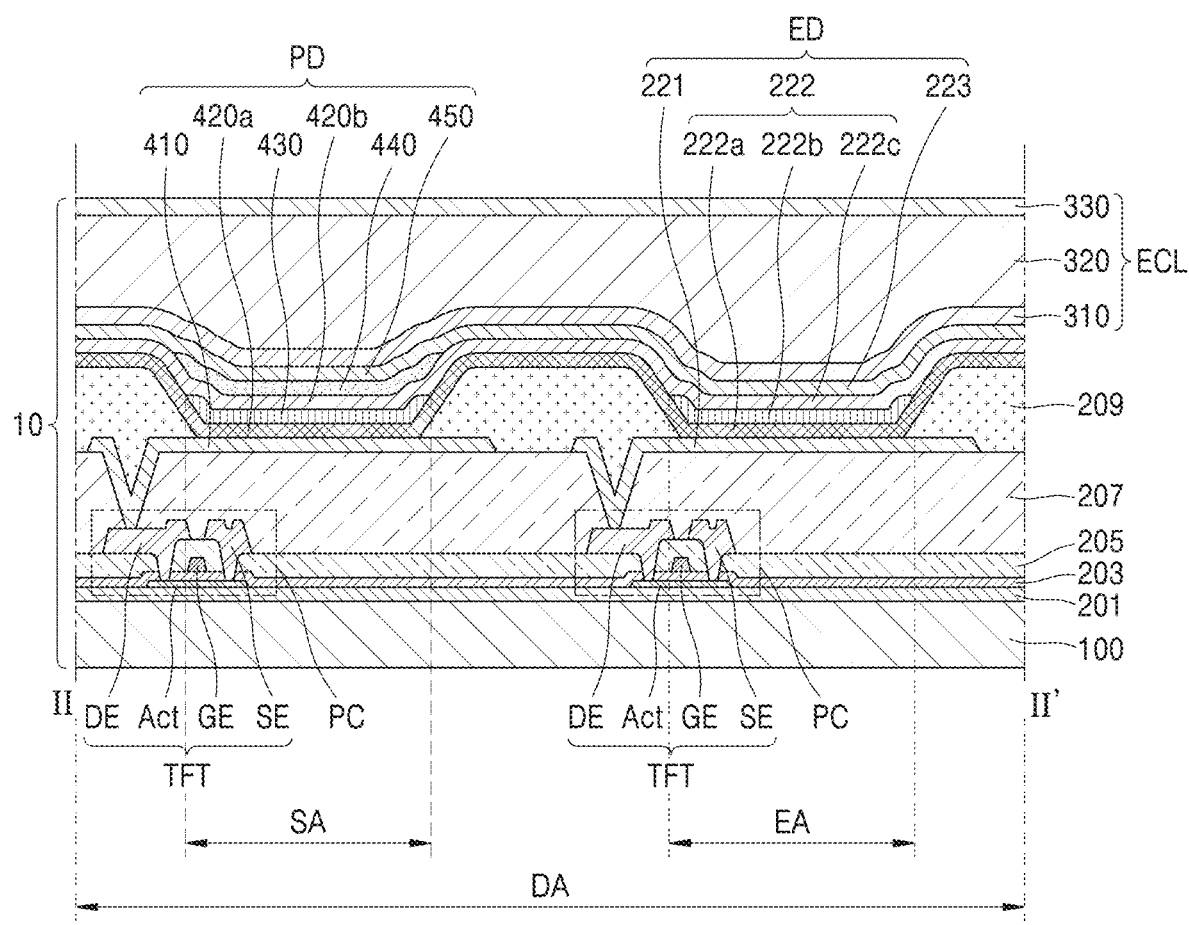
FIG. 8A is a schematic cross-sectional view of a portion of a second unit pixel according to an embodiment.
Figure 8B:
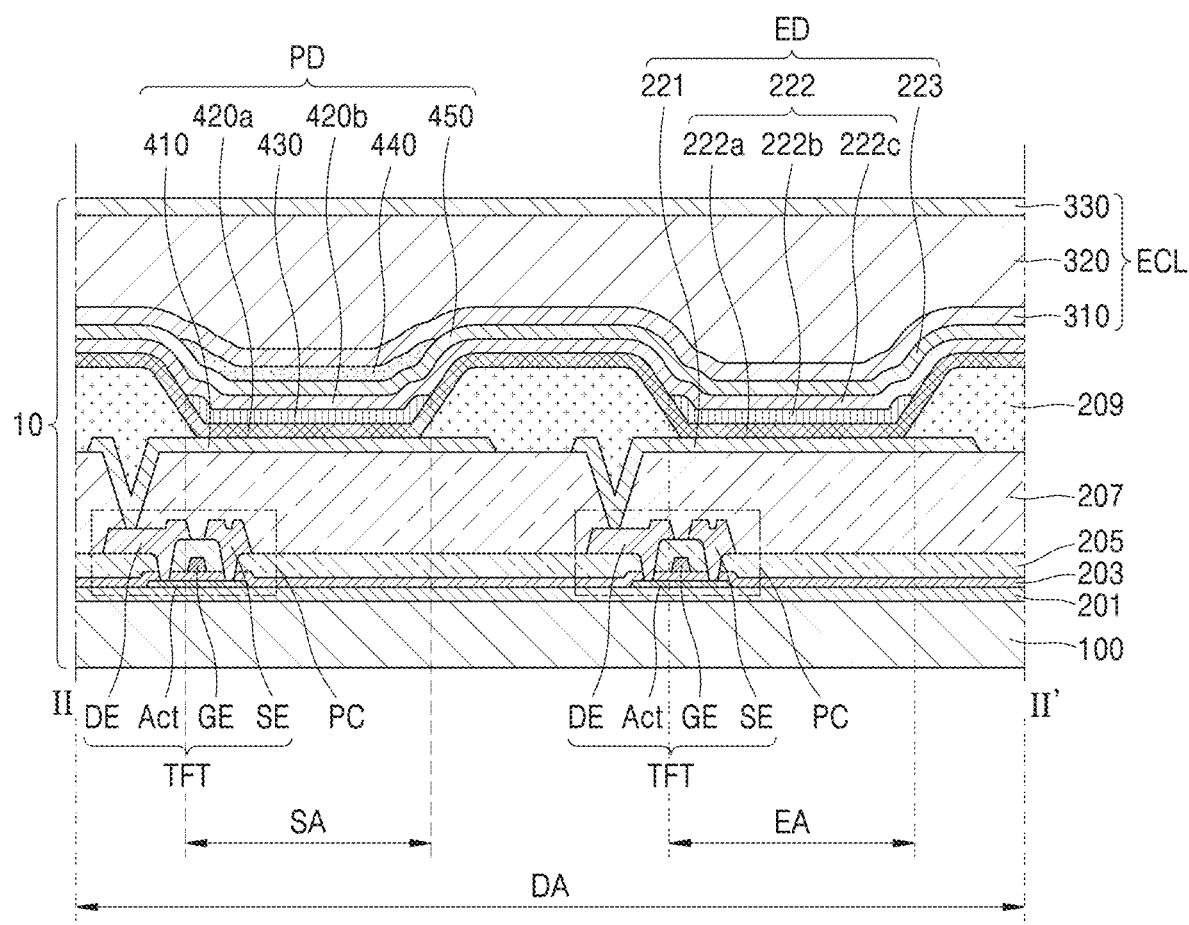
FIG. 8B is a schematic cross-sectional view of a portion of a second unit pixel according to another embodiment.

FIGS. 8A and 8B are schematic cross-sectional views of a portion of a second unit pixel according to some embodiments. FIGS. 8A and 8B each correspond to the cross-sectional view of the display panel 10 taken along line II-II' of FIG. 4. In the drawings, like reference numerals refer to like elements, and redundant descriptions thereof are omitted.

Referring to FIGS. 8A and 8B, a buffer layer 201 may be disposed on the substrate 100. The buffer layer 201 may reduce or prevent infiltration of foreign materials such as moisture or external air from under the substrate 100, and may improve the smoothness of an upper surface of the substrate 100. The buffer layer 201 may include an inorganic material such as an oxide or a nitride, an organic material, or an organic/inorganic composite, and may have a single layer or multilayer structure of an inorganic material or/and an organic material. A barrier layer (not shown) for blocking infiltration of external air may be further be provided between the substrate 100 and the buffer layer 201.

The thin film transistor TFT may be disposed on the buffer layer 201. The thin film transistor TFT may include a semiconductor layer Act, a gate electrode GE, a source electrode SE, and a drain electrode DE. In the present embodiment, although a top gate type in which the gate electrode GE is arranged on the semiconductor layer Act with a gate insulating layer 203 therebetween, in an embodiment, the thin film transistor TFT may be a bottom gate type.

The semiconductor layer Act may be disposed on the buffer layer 201. The semiconductor layer Act may include a channel region, and a source region and a drain region arranged at both sides of the channel region and doped with impurities. In this state, the impurities may include N-type impurities or P-type impurities. The semiconductor layer Act may include amorphous silicon or poly silicon. In a detailed example, the semiconductor layer Act may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). Furthermore, the semiconductor layer Act may include a Zn oxide-based material, for example, a Zn oxide, an In—Zn oxide, a Ga—In—Zn oxide, or the like. Furthermore, the semiconductor layer Act may include an IGZO (In—Ga—Zn—O), ITZO (In—Sn—Zn—O), or IGTZO (In—Ga—Sn—Zn—O) semiconductor obtained by adding metal such as In, Ga, or Sn to ZnO.

The gate electrode GE may be disposed above the semiconductor layer Act to at least partially overlap the semiconductor layer Act in a plan view. In detail, the gate electrode GE may overlap the channel region of the semiconductor layer Act. The gate electrode GE may include various conductive materials including molybdenum (Mo), Al, copper (Cu), Ti, or the like, and may have various layer structures. For example, the gate electrode GE may include a Mo layer and an Al layer, or may have a multilayer structure of Mo layer/Al layer/Mo layer. Furthermore, the gate electrode GE may have a multilayer structure including an ITO layer covering a metal material.

The gate insulating layer 203 between the semiconductor layer Act and the gate electrode GE may include an inorganic insulating material such as a silicon oxide, a silicon nitride, a silicon oxynitride, an aluminum oxide, a titanium oxide, a tantalum oxide, a hafnium oxide, or the like. The gate insulating layer 203 may be a single layer or multilayer including the above-described material.

The source electrode SE and the drain electrode DE may be connected to the source region and the drain region of the semiconductor layer Act, through a contact hole. The source electrode SE and the drain electrode DE each may include various conductive materials including Mo, Al, Cu, Ti, or the like, and have various layer structures. For example, the source electrode SE and the drain electrode DE each may include a Ti layer and an Al layer, or have a multilayer structure of Ti layer/Al layer/Ti layer. Furthermore, the source electrode SE and the drain electrode DE each may have a multilayer structure including an ITO layer covering a metal material.

An interlayer insulating layer 205 may include an inorganic insulating material such as a silicon oxide, a silicon nitride, a silicon oxynitride, an aluminum oxide, a titanium oxide, a tantalum oxide, a hafnium oxide, or the like.

Furthermore, the interlayer insulating layer 205 may be a single layer or multilayer including the above-described material.

As such, the gate insulating layer 203 and the interlayer insulating layer 205, each including an inorganic material, may be formed through chemical vapor deposition ("CVD") or atomic layer deposition ("ALD"), or the like, but the disclosure according to the invention is not limited thereto.

The thin film transistor TFT may be covered with an organic insulating layer 207. For example, the organic insulating layer 207 may cover the source electrode SE and the drain electrode DE. The organic insulating layer 207 may be disposed above the substrate 100 across the display area DA and the peripheral area PA of FIG. 1 outside the display area DA. The organic insulating layer 207, as a planarized insulating layer, may have a flat upper surface. The organic insulating layer 207 may include a general-purpose polymer such as polymethylmethacrylate ("PMMA") or polystyrene ("PS"), or an organic insulating material such as polymer derivatives with a phenol group, acryl-based polymers, imide-based polymers, arylether-based polymers, amide-based polymers, fluorine-based polymers, p-xylene-based polymers, vinyl alcohol-based polymers, and blends thereof. In an embodiment, the organic insulating layer 207 may include polyimide.

The light-emitting diode ED and the photodetector diode PD may be disposed on the organic insulating layer 207. The light-emitting diode ED may include the first electrode 221, the first common layer 222a, the emission layer 222b, the second common layer 222c, and the second electrode 223, and the photodetector diode PD may include the third electrode 410, the third common layer 420a, the active layer 430, the fourth common layer 420b, the color filter layer 440, and the fourth electrode 450, in which the descriptions of the redundant configurations are omitted.

Parts of the third common layer 420a and the fourth common layer 420b of the photodetector diode PD may be omitted. Furthermore, as illustrated in FIG. 8A, the color filter layer 440 of the photodetector diode PD may be disposed below the fourth electrode 450, that is, between the fourth electrode 450 and the active layer 430. Unlike the above, as illustrated in FIG. 8B, the color filter layer 440 of the photodetector diode PD may be disposed above the fourth electrode 450.

The pixel definition layer 209 may be disposed on the organic insulating layer 207 by covering edges of the first electrode 221 and the third electrode 410. The pixel definition layer 209 may define a pixel opening for exposing at least part of each of upper surfaces of the first electrode 221 and the third electrode 410. Accordingly, the pixel definition layer 209 may define the light-emitting area EA and the sensing area SA. Furthermore, the pixel definition layer 209 increases a distance between the edge of the first electrode 221 and the second electrode 223 and a distance between the edge of the third electrode 410 and the fourth electrode 450 so that generation of arc, or the like at the edge of the first electrode 221 and the edge of the third electrode 410 may be prevented.

The pixel definition layer 209 may include an organic insulating material such as polyimide, polyimide, acryl resin, benzocyclobutene, hexamethyldisiloxane ("HMDSO"), phenol resin, or the like, and may be formed by a method such as spin coating, or the like.

The light-emitting diode ED and the photodetector diode PD may be covered by the encapsulation layer ECL. The encapsulation layer ECL may include a first inorganic encapsulation layer 310, an organic encapsulation layer 320 covering the first inorganic encapsulation layer 310, and a second inorganic encapsulation layer 330 covering the organic encapsulation layer 320.

Figure 9A:
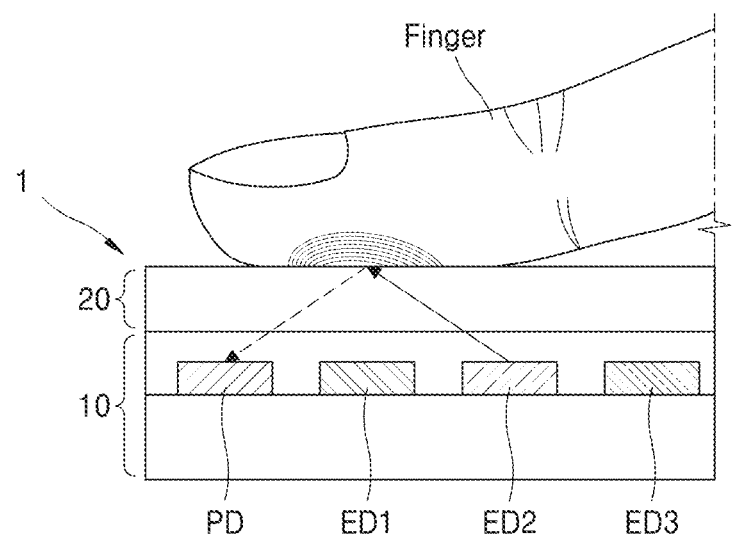
FIGS. 9A to 9C are schematic cross-sectional views showing an operation of a photodetector diode according to some embodiments.
Figure 9B:
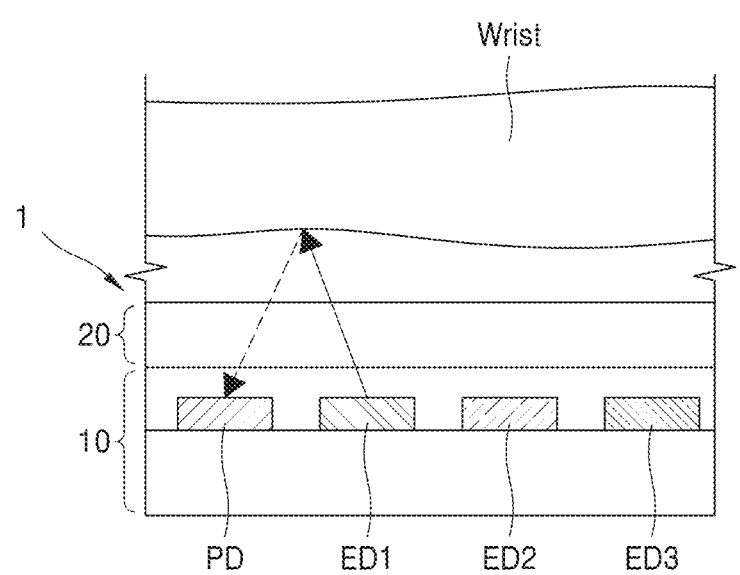
Figure 9C:
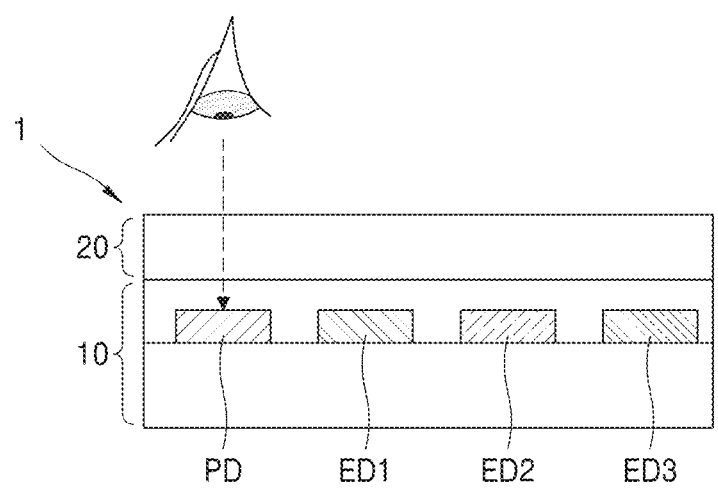

FIGS. 9A to 9C are schematic cross-sectional views of an operation of a photodetector diode according to some embodiments.

As illustrated in FIGS. 9A to 9C, the display apparatus 1 according to an embodiment may include the display panel 10 and a cover window 20.

The cover window 20 may cover and protect the display panel 10. The cover window 20 may include a transparent material. The cover window 20 may include, for example, glass or plastic. In another embodiment, the cover window 20 may be omitted.

The display panel 10 may include light-emitting diodes ED1, ED2, and ED3 and the photodetector diode PD.

The light-emitting diodes ED1, ED2, and ED3 may emit light different from one another. For example, the first light-emitting diode ED1 may emit light belonging to a red wavelength band, the second light-emitting diode ED2 may emit light belonging to a green wavelength band, and the third light-emitting diode ED3 may emit light belonging to a blue wavelength band.

The photodetector diode PD may include the color filter layer 440 of FIG. 7A that transmits only light belonging to a preset wavelength band. For example, the photodetector diode PD of FIGS. 9A and 9B may include a color filter layer that transmits only light belonging to a green wavelength band, that is, light belonging to a wavelength band in a range of 495 nm to 570 nm, and the photodetector diode PD of FIG. 9C may include a color filter layer that transmits only light belonging to a red wavelength band, that is, light belonging to a wavelength band in a range of 630 nm to 850 nm.

As illustrated in FIG. 9A, the display apparatus 1 according to an embodiment may have a function of sensing an object in contact with the display apparatus 1, for example, a fingerprint of a finger. As at least part of reflected light emitted from a light-emitting diode and reflected from a fingerprint of a user is input again to the photodetector diode PD, the photodetector diode PD may detect the reflected light. Ridges of a fingerprint pattern of a finger is in close contact with an upper surface of the cover window 20, the photodetector diode PD may obtain image information of a fingerprint pattern, for example, ridge, of a user.

Although FIG. 9A illustrates an example in which the photodetector diode PD includes a color filter layer that transmits only light belonging to a green wavelength band, that is, light belonging to a wavelength band in a range of 495 nm to 570 nm, and information about an object in contact with the display apparatus 1 is obtained by using the light emitted from the second light-emitting diode ED2 that emits light belonging to a green wavelength band, the disclosure according to the invention is not limited thereto. For example, the same may be applied to a case in which the photodetector diode PD includes a color filter layer that transmits only light belonging to a red wavelength band, that is, light belonging to a wavelength band in a range of 630 nm to 850 nm, and information is obtained by using the light emitted from the first light-emitting diode ED1 that emits light belonging to a red wavelength band. Furthermore, the same may be applied to a case in which the photodetector diode PD includes a color filter layer that transmits only light belonging to a blue wavelength band, that is, light belonging to a wavelength band in a range of 450 nm to 495 nm, and information is obtained by using the light emitted from the third light-emitting diode ED3 that emits light belonging to a blue wavelength band.

In this connection, as illustrated in FIG. 9B, the photodetector diode PD of the display apparatus 1 according to an embodiment may perform a biometric information sensing function. In detail, the photodetector diode PD may include a color filter layer that transmits only light belonging to a red wavelength band, that is, light belonging to a wavelength band in a range of 630 nm to 850 nm, and biometric information of a user may be obtained by using light emitted from the first light-emitting diode ED1 that emits light belonging to a red wavelength band. For example, the photodetector diode PD may act as a light-transmitting sensor that senses blood coral saturation, pulse waves, or the like.

Furthermore, referring to FIG. 9C, the display apparatus 1 according to an embodiment may have a function of sensing an object that is not in contact with the display apparatus 1.

Although the above description mainly focuses on a display apparatus only, the disclosure according to the invention is not limited thereto. For example, a method of manufacturing the above-described display apparatus may also belong to the scope of the disclosure.

According to the above-described embodiment, provided is a display apparatus including a photodetector diode with improved sensing sensitivity that is arranged to reduce a decrease in the area of a light-emitting area. The scope of the disclosure according to the invention is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
    a first unit pixel comprising a plurality of light-emitting diodes; and
    a second unit pixel comprising a plurality of light-emitting diodes and a photodetector diode,
    wherein each of the plurality of light-emitting diodes comprises a first electrode, a second electrode facing the first electrode, and an emission layer disposed between the first electrode and the second electrode, and
    the photodetector diode comprises a third electrode, a fourth electrode facing the third electrode, an active layer disposed between the third electrode and the fourth electrode, and a color filter layer disposed between the fourth electrode and the active layer.

2. The display apparatus of claim 1, wherein the second unit pixel comprises a second-1 unit pixel and a second-2 unit pixel,
    the color filter layer of the photodetector diode of the second-1 unit pixel comprises a first-color color filter layer which transmits only light of a wavelength in a first wavelength band, and
    the color filter layer of the photodetector diode of the second-2 unit pixel comprises a second-color color filter layer which transmits only light of a wavelength in a second wavelength band.

3. The display apparatus of claim 2, wherein the first wavelength band is about 630 nanometers (nm) to about 850 nm, and
    the second wavelength band is about 495 nm to about 570 nm.

4. The display apparatus of claim 1, wherein, in a plan view, an area of the first unit pixel is the same as an area of the second unit pixel.

5. The display apparatus of claim 4, wherein each of the first unit pixel and the second unit pixel comprises a first-color light-emitting area, a second-color light-emitting area, and a third-color light-emitting area, and
    in the plan view, an area of the second-color light-emitting area of the first unit pixel is greater than an area of the second-color light-emitting area of the second unit pixel.

6. The display apparatus of claim 1, wherein the active layer comprises a bulk heterojunction (BHJ) structure.

7. The display apparatus of claim 1, wherein the first electrode and the third electrode are disposed in a same layer and comprises a same material, and
    the second electrode and the fourth electrode are disposed in a same layer and comprises a same material.

8. The display apparatus of claim 7, wherein the second electrode and the fourth electrode are integrally provided.

9. The display apparatus of claim 1, wherein each of the plurality of light-emitting diodes comprises at least one of a first common layer disposed between the first electrode and the emission layer and a second common layer disposed between the second electrode and the emission layer, and
    the photodetector diode comprises at least one of a third common layer disposed between the third electrode and the active layer and a fourth common layer disposed between the fourth electrode and the active layer.

10. The display apparatus of claim 9, wherein the first common layer and the third common layer are integrally provided, and
    the second common layer and the fourth common layer are integrally provided.

11. A display apparatus comprising:
    a first unit pixel comprising a plurality of light-emitting diodes; and
    a second unit pixel comprising a plurality of light-emitting diodes and a photodetector diode,
    wherein each of the plurality of light-emitting diodes comprises a first electrode, a second electrode facing the first electrode, and an emission layer disposed between the first electrode and the second electrode, and
    the photodetector diode comprises a third electrode, a fourth electrode facing the third electrode, an active layer disposed between the third electrode and the fourth electrode, and a color filter layer disposed directly on the fourth electrode.

12. The display apparatus of claim 11, wherein the second unit pixel comprises a second-1 unit pixel and a second-2 unit pixel,
    the color filter layer of the photodetector diode of the second-1 unit pixel comprises a first-color color filter layer which transmits only light of a wavelength in a first wavelength band, and
    the color filter layer of the photodetector diode of the second-2 unit pixel comprises a second-color color filter layer which transmits only light of a wavelength in a second wavelength band.

13. The display apparatus of claim 12, wherein the first wavelength band is about 630 nm to about 850 nm, and
the second wavelength band is about 495 nm to about 570 nm.

14. The display apparatus of claim 11, wherein, in a plan view, an area of the first unit pixel is the same as an area of the second unit pixel.

15. The display apparatus of claim 14, wherein each of the first unit pixel and the second unit pixel comprises a first-color light-emitting area, a second-color light-emitting area, and a third-color light-emitting area, and,
in the plan view, an area of the second-color light-emitting area of the first unit pixel is greater than an area of the second-color light-emitting area of the second unit pixel.

16. The display apparatus of claim 11, wherein the active layer comprises a bulk heterojunction (BHJ) structure.

17. The display apparatus of claim 11, wherein the first electrode and the third electrode are disposed in a same layer and comprises a same material, and the second electrode and the fourth electrode are disposed in a same layer and comprises a same material.

18. The display apparatus of claim 17, wherein the second electrode and the fourth electrode are integrally provided.

19. The display apparatus of claim 11, wherein each of the plurality of light-emitting diodes comprises at least one of a first common layer disposed between the first electrode and the emission layer and a second common layer disposed between the second electrode and the emission layer, and
the photodetector diode comprises at least one of a third common layer disposed between the third electrode and the active layer and a fourth common layer disposed between the fourth electrode and the active layer.

20. The display apparatus of claim 19, wherein the first common layer and the third common layer are integrally provided, and the second common layer and the fourth common layer are integrally provided.

* * * * *